(12) United States Patent
Miyoshi et al.

(10) Patent No.: US 7,507,302 B2
(45) Date of Patent: *Mar. 24, 2009

(54) METHOD FOR PRODUCING NANOCOMPOSITE MAGNET USING ATOMIZING METHOD

(75) Inventors: Toshio Miyoshi, Mishima-gun (JP); Hirokazu Kanekiyo, Kyoto (JP); Satoshi Hirosawa, Otsu (JP)

(73) Assignee: Hitachi Metals, Ltd., Tokyo (JP)

( * ) Notice: Subject to any disclaimer, the term of this patent is extended or adjusted under 35 U.S.C. 154(b) by 301 days.

This patent is subject to a terminal disclaimer.

(21) Appl. No.: 10/484,072

(22) PCT Filed: Jul. 19, 2002

(86) PCT No.: PCT/JP02/07369

§ 371 (c)(1),
(2), (4) Date: Jan. 16, 2004

(87) PCT Pub. No.: WO03/012802

PCT Pub. Date: Feb. 13, 2003

(65) Prior Publication Data

US 2004/0194856 A1 Oct. 7, 2004

(30) Foreign Application Priority Data

Jul. 31, 2001 (JP) .............................. 2001-231560

(51) Int. Cl.
*H01F 1/053* (2006.01)
*H01F 1/057* (2006.01)
*H01F 1/058* (2006.01)

(52) U.S. Cl. .................... 148/302; 148/301; 420/83; 420/121

(58) Field of Classification Search ........................ None
See application file for complete search history.

(56) References Cited

U.S. PATENT DOCUMENTS 4,585,473 A 4/1986 Narasimhan et al.

(Continued)

FOREIGN PATENT DOCUMENTS

DE 197 39 959 A1 3/1998

(Continued)

OTHER PUBLICATIONS

U.S. Appl. No. 10/381,005, filed on Mar. 20, 2003, currently pending; for: "Iron-Based Rare Earth Alloy Nanocomposite Magnet and Method for Producing the Same"; Applicants: Hirokazu Kanekiyo et al.

(Continued)

*Primary Examiner*—John P. Sheehan
(74) *Attorney, Agent, or Firm*—Keating & Bennett, LLP

(57) ABSTRACT

A rare-earth alloy powder is obtained by rapidly cooling a melt of an alloy by an atomization process. The alloy has a composition represented by $(Fe_{1-m}T_m)_{100-x-y-z}Q_xR_yTi_zM_n$, where T is at least one of Co and Ni, Q is at least one of B and C, R is at least one of the rare-earth metal elements and yttrium, and M is at least one of Nb, Zr, Mo, Ta and Hf. The mole fractions x, y, z, m and n satisfy 10 at %$<x\leq$25 at %, 6 at %$\leq y<$10 at %, 0.1 at %$\leq z\leq$12 at %, 0$\leq m\leq$0.5, and 0 at %$\leq n\leq$10 at %, respectively. By adding Ti to the alloy, the nucleation and growth of α-Fe during the rapid quenching process can be minimized.

10 Claims, 2 Drawing Sheets

U.S. PATENT DOCUMENTS

| | | | |
|---|---|---|---|
| 4,597,938 A | 7/1986 | Matsuura et al. | |
| 4,664,724 A | 5/1987 | Mizoguchi et al. | |
| 4,770,723 A | 9/1988 | Sagawa et al. | |
| 4,802,931 A | 2/1989 | Croat | |
| 4,836,868 A | 6/1989 | Yajima et al. | |
| 4,845,837 A | 7/1989 | Loyd | |
| 4,851,058 A | 7/1989 | Croat | |
| 4,935,074 A | 6/1990 | De Mooij et al. | |
| 4,994,109 A | 2/1991 | Willman et al. | |
| 5,022,939 A | 6/1991 | Yajima et al. | |
| 5,049,203 A | 9/1991 | Mukai et al. | |
| 5,049,208 A | 9/1991 | Yajima et al. | |
| 5,190,684 A | 3/1993 | Yamashita et al. | |
| 5,209,789 A | 5/1993 | Yoneyama et al. | |
| 5,225,004 A | 7/1993 | O'Handley et al. | |
| 5,230,749 A | 7/1993 | Fujimura et al. | |
| 5,240,513 A | 8/1993 | McCallum et al. | |
| 5,595,608 A | 1/1997 | Takebuchi et al. | |
| 5,597,425 A | 1/1997 | Akioka et al. | |
| 5,665,177 A | 9/1997 | Fukuno et al. | |
| 5,666,635 A | 9/1997 | Kaneko et al. | |
| 5,725,792 A | 3/1998 | Panchanathan | |
| 5,803,992 A * | 9/1998 | McCallum et al. | 148/302 |
| 5,834,663 A | 11/1998 | Fukuno et al. | |
| 5,872,501 A | 2/1999 | Hamano et al. | |
| 5,905,424 A | 5/1999 | Panchanathan | |
| 6,022,424 A | 2/2000 | Sellers et al. | |
| 6,172,589 B1 | 1/2001 | Fujita et al. | |
| 6,183,571 B1 | 2/2001 | Inoue et al. | |
| 6,183,572 B1 | 2/2001 | Panchanathan et al. | |
| 6,261,385 B1 | 7/2001 | Nomura et al. | |
| 6,280,536 B1 | 8/2001 | Inoue et al. | |
| 6,302,972 B1 | 10/2001 | Hirosawa et al. | |
| 6,332,933 B1 | 12/2001 | Ma et al. | |
| 6,352,599 B1 | 3/2002 | Chang et al. | |
| 6,386,269 B1 | 5/2002 | Kanekiyo et al. | |
| 6,471,786 B1 | 10/2002 | Shigemoto et al. | |
| 6,478,889 B2 | 11/2002 | Kanekiyo | |
| 6,648,984 B2 | 11/2003 | Takaki et al. | |
| 6,706,124 B2 | 3/2004 | Kanekiyo et al. | |
| 6,790,296 B2 | 9/2004 | Kanekiyo et al. | |
| 6,796,363 B2 | 9/2004 | Arai et al. | |
| 6,814,776 B2 | 11/2004 | Kanekiyo et al. | |
| 6,890,392 B2 | 5/2005 | Kanekiyo et al. | |
| 6,951,625 B2 | 10/2005 | Arai et al. | |
| 2001/0015239 A1 | 8/2001 | Kanekiyo | |
| 2002/0017339 A1 | 2/2002 | Kanekiyo et al. | |
| 2002/0117235 A1 | 8/2002 | Kanekiyo et al. | |
| 2003/0136468 A1 | 7/2003 | Kanekiyo et al. | |
| 2004/0051614 A1 | 3/2004 | Kanekiyo et al. | |
| 2004/0099346 A1 | 5/2004 | Nishiuchi et al. | |
| 2004/0134567 A1 | 7/2004 | Kanekiyo et al. | |
| 2004/0194856 A1 | 10/2004 | Miyoshi et al. | |
| 2005/0040923 A1 | 2/2005 | Miyoshi et al. | |

FOREIGN PATENT DOCUMENTS

| | | |
|---|---|---|
| EP | 0 197 712 | 10/1986 |
| EP | 0 302 395 | 7/1988 |
| EP | 0 529 148 A2 | 3/1993 |
| EP | 0 632 471 A2 | 1/1995 |
| EP | 0 874 375 A1 | 10/1998 |
| EP | 0 959 478 A1 | 11/1999 |
| EP | 1 018 751 A1 | 7/2000 |
| EP | 1 061 532 A1 | 12/2000 |
| EP | 1 158 545 | 11/2001 |
| EP | 1 207 537 | 5/2002 |
| EP | 1 371 434 A1 | 12/2003 |
| HU | 199904 B | 1/1989 |
| JP | 59-046008 | 3/1984 |
| JP | 60-9852 A | 1/1985 |
| JP | 61-140350 | 6/1986 |
| JP | 62-062503 | 3/1987 |
| JP | 63-155601 | 6/1988 |
| JP | 63-190138 | 8/1988 |
| JP | 63-301505 | 12/1988 |
| JP | 63-313807 A | 12/1988 |
| JP | 64-000703 | 1/1989 |
| JP | 64-007501 | 1/1989 |
| JP | 64-007502 | 1/1989 |
| JP | 64-081301 | 3/1989 |
| JP | 01-100242 | 4/1989 |
| JP | 01-162702 | 6/1989 |
| JP | 01-204401 | 8/1989 |
| JP | 02-247307 | 10/1990 |
| JP | 2-298003 | 12/1990 |
| JP | 3-260018 | 11/1991 |
| JP | 03-261104 | 11/1991 |
| JP | 03-264653 | 11/1991 |
| JP | 04-098802 A | 3/1992 |
| JP | 04-147604 | 5/1992 |
| JP | 05-269549 | 10/1993 |
| JP | 05-315174 | 11/1993 |
| JP | 06-32471 | 2/1994 |
| JP | 06-140235 | 5/1994 |
| JP | 06-338407 | 12/1994 |
| JP | 07-122412 | 5/1995 |
| JP | 07-226312 | 8/1995 |
| JP | 08-053710 | 2/1996 |
| JP | 08-124730 | 5/1996 |
| JP | 8-162312 | 6/1996 |
| JP | 08-167515 | 6/1996 |
| JP | 08-322175 | 12/1996 |
| JP | 09-155507 | 6/1997 |
| JP | 09-155513 | 6/1997 |
| JP | 10-53844 | 2/1998 |
| JP | 10-088294 A | 4/1998 |
| JP | 10-282790 | 10/1998 |
| JP | 11-8109 | 1/1999 |
| JP | 11-71646 | 3/1999 |
| JP | 11-101607 | 4/1999 |
| JP | 11-206075 | 7/1999 |
| JP | 11-323509 | 11/1999 |
| JP | 2000-079449 | 3/2000 |
| JP | 2000-079451 | 3/2000 |
| JP | 2000-234137 | 8/2000 |
| JP | 2000-235909 | 8/2000 |
| JP | 2000-348919 | 12/2000 |
| JP | 2001-060504 A | 3/2001 |
| JP | 2001-244107 | 9/2001 |
| JP | 2002-64009 | 2/2002 |
| JP | 2002-80921 | 3/2002 |
| JP | 2002-175908 | 6/2002 |
| JP | 2002-212686 | 7/2002 |
| JP | 2002-239688 | 8/2002 |
| JP | 2002-302702 | 10/2002 |
| KR | 1998-16178 | 5/1998 |
| RU | 2 136 069 C1 | 8/1999 |
| WO | WO 99/21196 | 4/1999 |
| WO | WO 00/03403 | 1/2000 |
| WO | WO 00/52715 | 2/2000 |
| WO | 00 45397 A1 | 8/2000 |
| WO | WO 00/52713 | 9/2000 |
| WO | WO 01/68297 | 9/2001 |
| WO | WO 02/067275 | 8/2002 |
| WO | WO 02/093591 | 11/2002 |

OTHER PUBLICATIONS

U.S. Appl. No. 09/986,390, filed on Nov. 8, 2001, currently pending; for: "Nanocoposite Magnet and Method for Producing Same"; Applicants: Hirokazu Kanekiyo et al.

U.S. Appl. No. 09/863,902, filed on May 24, 2001, currently pending; for: "Permanent Magnet Including Multiple Ferromagnetic Phases and Method for Producing the Magnet"; Applicants: Hirokazu Kanekiyo et al.

L. Henderson Lewis et al. "Phase Composition and Magnetic Characteristics of Inert Gas-Atomized RE-Fe-B-Based Powers", IEEE Transactions on Magnetics, vol. 31, No. 6, Nov. 1995, pp. 3641-3643.

D.J. Branagan, et al., "A New Generation of Gas Atomized Power with Improved Levels of Energy Product and Processability", IEEE Transactions on Magnetics, vol. 32, No. 5, Sep. 1996, pp. 5097-5099.

Z. S. Wronski, "Microstructure and Magnetic Properties of Low-Neodymium Nd-Fe-B-Si Magnets Produced from HP Gas Atomized Powder", J. Appl. Phys. 69 (8), Apr. 1991, pp. 5507-5509.

M.J. Kramer et al., "A Generalized Solidification Model and Microstructural Verification for the Nd-Fe-B-Ti-C System Processed by Rapid Solidification", J. Appl. Phys. 81(8), Apr. 1997. pp. 4459-4461.

Missell et al., "Rare-Earth Magnets and Their Applications," Proceedings of the 14th International Workshop, Sep. 1996, pp. 28-37, vol. 1, World Scientific, Singapore, new Jersey, London, Hong Kong.

Chang et al., The Effects of Refractory Metals on the Magnetic Properties of α-Fe/$R_2Fe_{14}B$—Type Nanocomposites, IEEE Transactions on Magnetics, Sep. 1999, pp. 3265-3267, vol. 35, No. 5, Part 2, IEEE Inc., New York, U.S.

Chang et al., "High Performance α-Fe/$Nd_2Fe_{14}B$-type Nanocomposites", pp. 121-123, Jan. 1998, Applied Physics Letters, vol. 72, No. 1.

Chiriac, et al., "$Nd_8Fe_{73}Co_5Hf_2B_{12}$ strip cast alloy", Journal of Applied Physics, vol. 87 No. 9, May 2000, pp. 5338-5340.

Lewis L H et al, "Compositional Clustering in ND2FE14B Melt-Spun Ribbons" Journal of Applied Physics, American Institue of Physics. New York, US, vol. 87, No. 9, May 1, 2000, pp. 4735-4737.

Chang et al., "Magnetic and Microstructure Studies of Boron-Enriched($Nd_{0.95}La_{0.05})_{11}Fe_{76.5-x}CoxTi_2B_{10.5}$(x+0-15) Melt-Spun Ribbons", pp. 3312-3314, Sep. 2000, IEEE Transactions on Magnetics, vol. 36, No. 5.

Chang et al., "The Effect of La-Substitution on the Microstructure and Magnetic Properties of Nanocomposite NdFeB Melt Spun Ribbons", pp. 65-70, Mar. 1997, Journal of Magnetism and Magnetic Materials, vol. 167, Nos. 1-2.

Chang et al., "High Performance α-Fe/$R_2Fe_{14}B$-Type Nanocomposites with Nominal Compositions of $(Nd, La)_{9.5} Fe_{78-x}Co_xCr_2B_{10.5}$", Journal of Magnetism and Magnetic Materials, vol. 189, No.1 (1998), pp. 55-61.

Chang et al., "The effect of boron and rare earth contents on the magnetic properties of La and Cr substituted α-Fe/$R_2Fe_{14}B$-Type Nanocomposites", Journal of Applied Physics, vol. 83 No. 11, June 1998pp.6271-6273.

Hermann et al., "Growth Kinetics in Undercooled Nd-Fe-B Alloys with Carbon and Ti or Mo Additions" pp.82-86, Apr. 2000, Journal of Magnetism and Magnetic Materials, vol. 213, Nos. 1-2.

J. Bernardi, et al., "Microstructural analysis of strip cast Nd-Fe-B alloys for high (BH)$_{max}$ magnets", Journal of Applied Physics, vol. 83 No. 11, Jun. 1998, pp. 6396-6398.

Merkulova et al., "The Temperature Dependence of Coercivity in Nancrystallyne Nd-Fe-B-(TIC) Magnets", Journal of Applied Physics, vol. 87, No. 9, (2000), pp. 4738-4740.

Q. Chen, et al., "A Study on the Phase Transformation and Exchange-coupling of $(Nd_{0.95}La_{0.05})_{9.5}$ $Fe_{bal}C_{05}Nb2B_{10.5}$ Nanaocomposites, Materials Research Society Symposium Proceedings ", Vo.577, Apr. 1999, pp. 209-219.

R. Coehoorn, et al., "Novel Permanent Magnetic Materials Made by Rapid Quenching ", Journal de Physique, C8, Dec. 1998, pp. 669-670.

Yao, J.M. et al, "Coercivity of Ti-modified (α-Fe)-$Nd_2Fe_{14}B$ Nanocrystalline Alloys ", Journal of Applied Physics, Nov. 15, 1994, pp. 7071-7073. vol. 76, No. 10, American Institute of Physics, Woodbury, New York, USA.

Fumitoshi Yamashita, "Applications of Rare-Earth Magnets to the Small Motor Industry", Proceeding of the Seventeenth International Workshop, Aug. 18-22, 2002, Newark, Delaware, USA, pp. 100-111.

U.S. Appl. No. 10/432,862, filed May. 28, 2003. "Nanocomposite magnet."

U.S. Appl. No. 10/484,072, filed Jan. 16, 2004. "Method for producing nanocomposite magnet using atomizing method."

U.S. Appl. No. 10/642,324, filed Aug. 18, 2003. "Compound for rare-earth bonded magnet and bonded magnet using the compound."

U.S. Appl. No. 10/745,834, filed Dec. 24, 2003. "Permanent magnet including multiple ferromagnetic phases and method for producing the magnet."

U.S. Appl. No. 09/455,469, filed Dec. 6, 1999. "Nanocomposite magnet material and method for producing nanocomposite magnet material."

Office action issued Mar. 28, 2005. U.S. Appl. No. 10/381,005. "Iron-based rare earth alloy nanocomposite magnet and method for producing the same."

Office Action issued Jun. 17, 2005. U.S. Appl. No. 10/432,862. "Nanocomposite Magnet."

Official Communication issued in the counterpart Japanese Application No. 2003-517890, mailed on Aug. 28, 2007.

* cited by examiner

METHOD FOR PRODUCING NANOCOMPOSITE MAGNET USING ATOMIZING METHOD

BACKGROUND OF THE INVENTION

1. Field of the Invention

The present invention relates to a method of making a nanocomposite magnet powder of an iron-based rare-earth alloy by an atomization process.

2. Description of the Related Art

Nd—Fe—B based iron-based rare-earth magnet alloys are currently used extensively in sintered magnets and bonded magnets. These magnets are produced in different ways. More specifically, a sintered magnet is made by pulverizing a magnet alloy, obtained by an ingot casting process, a strip casting process or any other process, compacting the pulverized powder, and then sintering the powder compact. On the other hand, a bonded magnet is made by rapidly cooling and solidifying a molten alloy by a melt spinning process, for example, pulverizing the resultant rapidly solidified alloy into a powder, compounding the powder with a resin, and then molding the mixture into a desired shape. In this manner, no matter whether the magnet to be produced is a sintered magnet or a bonded magnet, its magnet powder is always obtained by pulverizing the material magnet alloy. That is to say, the manufacturing process of magnets normally includes a pulverizing process step as an indispensable process step.

However, there are some methods of making a magnet powder without performing such a pulverizing process step. A gas atomization process is one of such methods that are known in the art. In the gas atomization process, a melt of an alloy is sprayed through a nozzle, for example, into an inert gas, and is made to collide against the gas, thereby cooling the melt droplets. In this manner, spherical particles with particle sizes on the order of several tens of micrometers can be formed directly. In the gas atomization process, the droplets of the molten metal are solidified while being carried in the gas-flow, thus forming substantially spherical particles. The powder obtained by the gas atomization process (i.e., an atomized powder) has preferred shapes and particle sizes as a magnet powder to make a bonded magnet.

If the atomization process is used to produce a bonded magnet, then the atomized powder can be used as it is as a magnet powder for a bonded magnet. Thus, no mechanical pulverizing process step is needed and the manufacturing cost can be reduced significantly. It should be noted, however, that the particle sizes of such an atomized powder are greater than those of a magnet powder to make a sintered magnet. Accordingly, it is difficult to use the atomized powder as it is as a magnet powder for a sintered magnet.

In a rapidly solidified rare-earth alloy magnet powder, which is currently used extensively to make a bonded magnet, an $Nd_2Fe_{14}B$ based compound phase with a crystal grain size of about 20 nm to about 200 nm is finely dispersed in the powder particles. Such a nanocrystalline structure is formed by rapidly cooling a molten alloy with a particular composition by a melt spinning process, for example, to make an amorphous alloy thin strip and then thermally treating and crystallizing the amorphous alloy thin strip.

Meanwhile, high-performance magnets, having a quite different metal structure from that of the rapidly solidified magnet described above, are also under vigorous development. A typical example of those magnets is a composite magnet called a "nanocomposite magnet (exchange spring magnet)". The nanocomposite magnet has a metal structure in which hard and soft magnetic phases are finely dispersed and in which the respective constituent phases are magnetically coupled together through exchange interactions. The respective constituent phases of the nanocomposite magnet have nanometer-scale sizes and its nanocrystalline structure, defined by the sizes and dispersiveness of the respective constituent phases, has significant effects on its magnet performance.

Among those nanocomposite magnets, a magnet in which an $Nd_2Fe_{14}B$ based compound phase (i.e., hard magnetic phase) and α-Fe, iron-based boride and other soft magnetic phases are distributed in the same metal structure, attracts particularly much attention. In the prior art, such a nanocomposite magnet is also made by rapidly cooling a molten alloy by the melt spinning process and then thermally treating and crystallizing the rapidly solidified alloy. If the powder of such a rapidly solidified magnet could be made by the gas atomization process, then no other pulverizing process step would be needed and the manufacturing cost could be reduced significantly.

Actually, however, it is very difficult to make the rapidly solidified magnet powder by the atomization process. This is because the melt-quenching rate by the atomization process is lower than that by the melt spinning process by as much as one to two orders of magnitude. Thus, a sufficiently amorphized alloy structure cannot be formed by the conventional atomization process.

As for non-nanocomposite rapidly solidified magnets (i.e., rapidly solidified magnets including only the $Nd_2Fe_{14}B$ based compound phase), a method of making an amorphous alloy producible even by the atomization process with such a low quenching rate by increasing the amorphous forming ability (i.e., quenchability) of the alloy with the addition of TiC, for example, was proposed.

However, as for an α-Fe/$R_2Fe_{14}B$ based nanocomposite magnet, it is difficult to produce an actually usable, high-performance magnet by the atomization process. The reason is that if the quenching rate is as low as in the atomization process, the soft magnetic α-Fe phase easily nucleates and grows earlier than the $R_2Fe_{14}B$ phase and increases its size so much that the exchange interactions among the respective constituent phases weaken and that the magnetic properties of the resultant nanocomposite magnet deteriorate significantly.

In order to overcome the problems described above, a primary object of the present invention is to make a powder of a nanocomposite magnet with excellent magnetic properties producible by the atomization process.

SUMMARY OF THE INVENTION

A nanocomposite magnet powder of an iron-based rare-earth alloy according to the present invention has a composition represented by the general formula: $(Fe_{1-m}T_m)_{100-x-y-z}Q_xR_yTi_zM_n$ (where T is at least one element selected from the group consisting of Co and Ni; Q is at least one element selected from the group consisting of B and C; R is at least one element selected from the group consisting of the rare-earth metal elements and yttrium; and M is at least one element selected from the group consisting of Nb, Zr, Mo, Ta and Hf). The mole fractions x, y, z, m and n satisfy the inequalities of: $10\,at\% < x \leq 25\,at\%$; $6\,at\% \leq y < 10\,at\%$; $0.1\,at\% \leq z \leq 12\,at\%$; $0 \leq m \leq 0.5$; and $0\,at\% \leq n \leq 10\,at\%$, respectively. The nanocomposite magnet powder includes at least two types of ferromagnetic crystalline phases, in which a hard magnetic phase has an average grain size of 10 nm to 200 nm and a soft magnetic phase has an average grain size of 1 nm to 100 nm.

In one preferred embodiment, an $R_2Fe_{14}B$ type compound phase, a boride phase and an α-Fe phase are present in the same metal structure.

In another preferred embodiment, the α-Fe and boride phases have an average crystal grain size of 1 nm to 50 nm, which is smaller than the average crystal grain size of the $R_2Fe_{14}B$ type compound phase, and are present on a grain boundary or sub-boundary of the $R_2Fe_{14}B$ type compound phase.

In another preferred embodiment, the boride phase includes a ferromagnetic iron-based boride.

In another preferred embodiment, the iron-based boride includes $Fe_3B$ and/or $Fe_{23}B_6$.

In another preferred embodiment, the magnet powder has a mean particle size of 1 μm to 100 μm.

In another preferred embodiment, the magnet powder exhibits hard magnetic properties including a coercivity $H_{cJ} \geq 480$ kA/m and a remanence $B_r \geq 0.6$ T.

A bonded magnet according to the present invention includes any of the iron-based rare-earth alloy nanocomposite magnet powders described above.

An inventive method of making an iron-based rare-earth alloy nanocomposite magnet powder includes the step of obtaining a rare-earth alloy magnet powder by rapidly cooling a melt of an alloy by an atomization process. The alloy has a composition represented by the general formula: $(Fe_{1-m}T_m)_{100-x-y-z}Q_xR_yTi_zM_n$ (where T is at least one element selected from the group consisting of Co and Ni; Q is at least one element selected from the group consisting of B and C; R is at least one element selected from the group consisting of the rare-earth metal elements and yttrium; and M is at least one element selected from the group consisting of Nb, Zr, Mo, Ta and Hf). The mole fractions x, y, z, m and n satisfy the inequalities of: 10 at %<x≤25 at %, 6 at %≤y<10 at %, 0.1 at %≤z≤12 at %, 0≤m≤0.5, and 0 at %≤n≤10 at %, respectively. The method further includes the step of thermally treating the magnet powder, thereby forming a structure that includes at least two types of ferromagnetic crystalline phases, in which a hard magnetic phase has an average grain size of 10 nm to 200 nm and a soft magnetic phase has an average grain size of 1 nm to 100 nm.

In one preferred embodiment, the step of rapidly cooling the melt by the atomization process results in making a rapidly solidified alloy including at least 60 vol % of $R_2Fe_{14}B$ type compound phase.

In another preferred embodiment, the soft magnetic phase includes a ferromagnetic iron-based boride.

In another preferred embodiment, the iron-based boride includes $Fe_3B$ and/or $Fe_{23}B_6$.

In a preferred embodiment, an inventive method for producing a bonded magnet includes the steps of: preparing a magnet powder by any of the methods described above; and processing the magnet powder into the bonded magnet.

DETAILED DESCRIPTION OF PREFERRED EMBODIMENTS

Figure 1A:
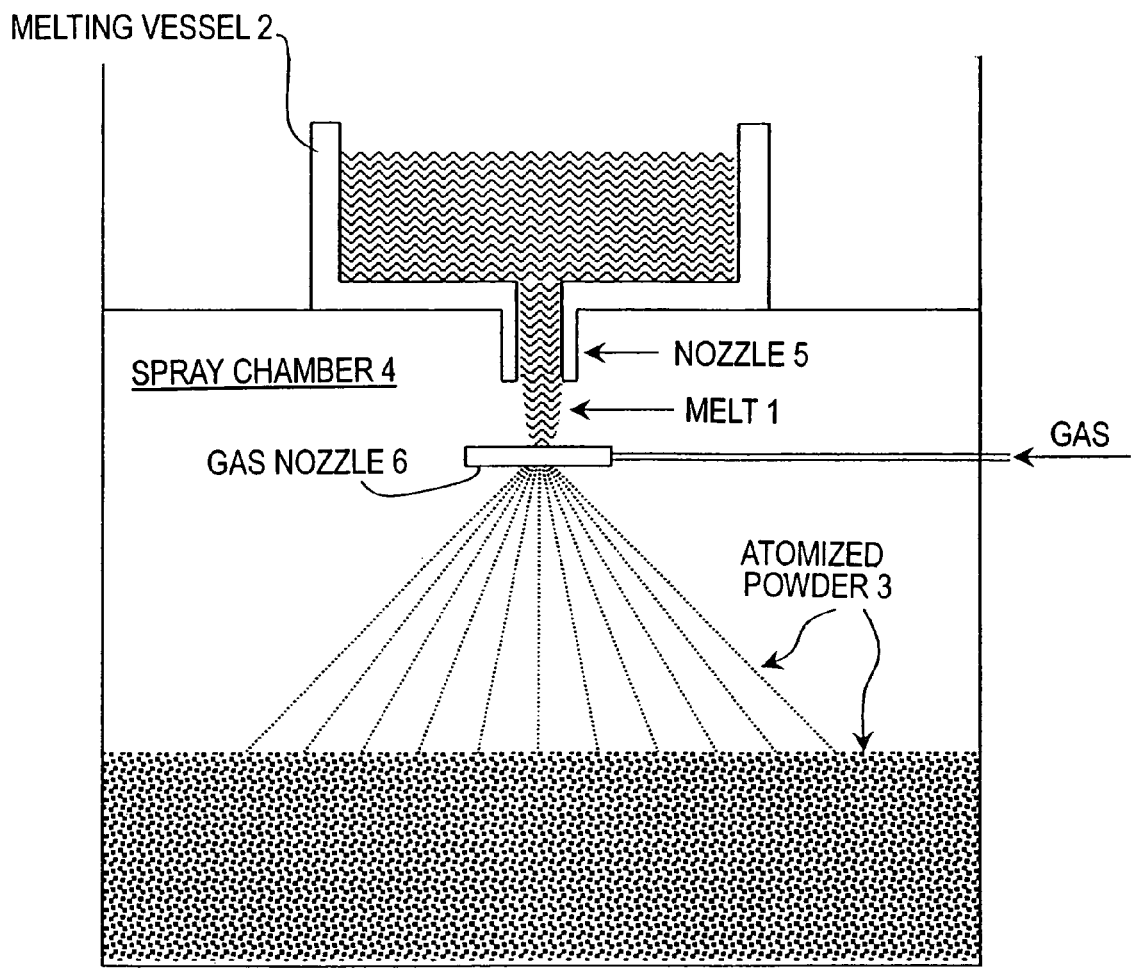
FIG. 1(a) is a view showing the configuration of a gas atomization system for use in an embodiment of the present invention.

According to the present invention, an iron-based rare-earth alloy nanocomposite magnet powder is obtained by rapidly cooling a melt of an alloy, having a composition represented by the general formula: $(Fe_{1-m}T_m)_{100-x-y-z}Q_xR_yTi_zM_n$, by an atomization process.

In this general formula, T is at least one element selected from the group consisting of Co and Ni, Q is at least one element selected from the group consisting of B and C, R is at least one element selected from the group consisting of the rare-earth metal elements and yttrium, and M is at least one element selected from the group consisting of Nb, Zr, Mo, Ta and Hf. The mole fractions x, y, z, m and n satisfy the inequalities of: 10 at %<x≤25 at %, 6 at %≤y<10 at %, 0.1 at %≤z≤12 at %, 0≤m≤0.5, and 0 at %≤n≤10 at %, respectively.

A 2-14-1 type hard magnetic compound, represented by the general formula $R_2(Fe_{1-m}T_m)_{14}Q$, will be simply referred to herein as an "$R_2Fe_{14}B$ based compound (or $R_2Fe_{14}B$ phase)". That is to say, the "$R_2Fe_{14}B$ based compound" or the "$R_2Fe_{14}B$ phase" includes an $R_2Fe_{14}B$ compound or phase in which a portion of Fe is replaced with Co and/or Ni or in which a portion of B is replaced with C. It should be noted that the "$R_2Fe_{14}B$ based compound" may further include additive elements such as Ti and M.

The present inventors carried out extensive researches to make a nanocomposite magnet by an atomization process. As a result, the present inventors discovered that the nucleation and growth of the α-Fe phase while the melt was rapidly quenched could be minimized by adding Ti to the material alloy. The present inventors acquired the basic idea of the present invention from this discovery.

According to the present invention, even at the relatively low quenching rate achievable by the atomization process, the $R_2Fe_{14}B$ phase as a main phase can be nucleated earlier than the α-Fe phase and yet the size of the $R_2Fe_{14}B$ phase is not allowed to reach such a size as to produce multiple magnetic domains in the $R_2Fe_{14}B$ phase (i.e., 300 nm). As a result, a magnet powder exhibiting excellent magnetic properties as a nanocomposite magnet can be obtained.

An α-Fe/$R_2Fe_{14}B$ based nanocomposite magnet to which the present invention is applied has a higher coercivity than an $Fe_3B$/$Nd_2Fe_{14}B$ based nanocomposite magnet. However, the former nanocomposite magnet has a relatively low B mole fraction of about 7 at % to about 10 at % and a relatively high Nd mole fraction of about 10 at % to about 12 at %. Thus, its alloy has very low ability to from amorphous phases. Accordingly, if the atomization process is applied without adding any Ti thereto, then just a powder in which the soft magnetic α-Fe phase has grown coarsely can be obtained and the magnetic properties thereof are insufficient. On the other hand, the $Fe_3B$/$Nd_2Fe_{14}B$ based nanocomposite magnet has a relatively high B mole fraction of about 18 at % to about 20 at % and has high ability to form amorphous phases. However, the magnet has a relatively low Nd mole fraction of about 3 at % to about 5 at % and exhibits low coercivity. Also, if the $Fe_3B$/$Nd_2Fe_{14}B$ based nanocomposite magnet is produced by the atomization process, powder particles with a relatively fine structure and amorphous phases can be obtained due to its high amorphous forming ability. Nevertheless, if the magnet is thermally treated and crystallized after that, the magnet itself generates some heat due to the crystallization and its crystal growth advances non-uniformly. Thus, the resultant nanocomposite magnet cannot exhibit high magnet performance.

As used herein, the "$Fe_3B$" includes "$Fe_{3.5}B$" which is hard to distinguish from "$Fe_3B$".

According to the present invention, by defining the mole fractions of Ti and other elements within appropriate ranges, a nanocomposite magnet powder with a nanocrystalline structure (i.e., a structure including at least 60 vol % of $Nd_2Fe_{14}B$ phase) can be obtained even by the atomization process. Thus, the heat treatment process for crystallization does not have to be carried out after that. However, to increase the uniformity of the alloy structure and further improve the magnet performance, the crystalline atomized powder is preferably thermally treated.

The structure of magnet powder particles according to the present invention includes at least two ferromagnetic crystalline phases, of which the hard magnetic phase has an average size of 10 nm to 200 nm and the soft magnetic phase has an average size of 1 nm to 100 nm. More particularly, the $R_2Fe_{14}B$ based compound phase exhibiting hard magnetic properties is uniformly dispersed in the alloy and the soft magnetic boride and α-Fe phases are present on the grain boundary or sub-boundary thereof. The average crystal grain size of the α-Fe and boride phases is smaller than that of the $R_2Fe_{14}B$ based compound phase, and is typically 1 nm to 50 nm. In a preferred embodiment, iron-based borides (such as $Fe_3B$ and/or $Fe_{23}B_6$) with ferromagnetic properties nucleate as the boride phases and high magnetization can be maintained.

As the present inventors disclosed in Japanese Patent Application No. 2001-144076, the boride phase (i.e., iron-based boride) is believed to be present at least partially as a film on the grain boundary of the $R_2Fe_{14}B$ based compound crystalline phase. When such a texture structure is obtained, the magnetic coupling (i.e., exchange interactions) between the ferromagnetic boride phase and the main phase further consolidates and the magnetization of the ferromagnetic boride phase is firmly maintained. As a result, even higher coercivity is believed to be achieved.

The magnet powder of the present invention having such a texture structure can be used effectively to make a bonded magnet. In making a bonded magnet, the magnet powder preferably has a mean particle size of 1 μm to 100 μm as measured by a scanning electron microscope.

Atomization Process

To make a permanent magnet powder by an atomization process from a molten alloy having the composition described above, a gas atomization process, a centrifugal atomization process, a rotational electrode process, a vacuum process, an impact process or any other suitable process may be adopted. When the centrifugal atomization process or the rotational electrode process is adopted, the quenching rate is preferably increased by blowing a gas at a high pressure.

Hereinafter, an embodiment that adopts a gas atomization process will be described with reference to FIGS. 1(a) and 1(b).

Figure 1B:
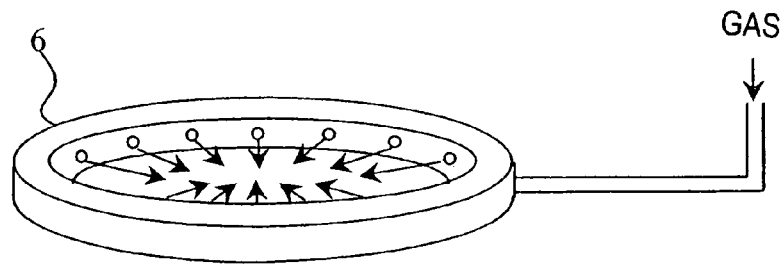
FIG. 1(b) is a perspective view illustrating a gas nozzle for use in this system.
Figure 2:
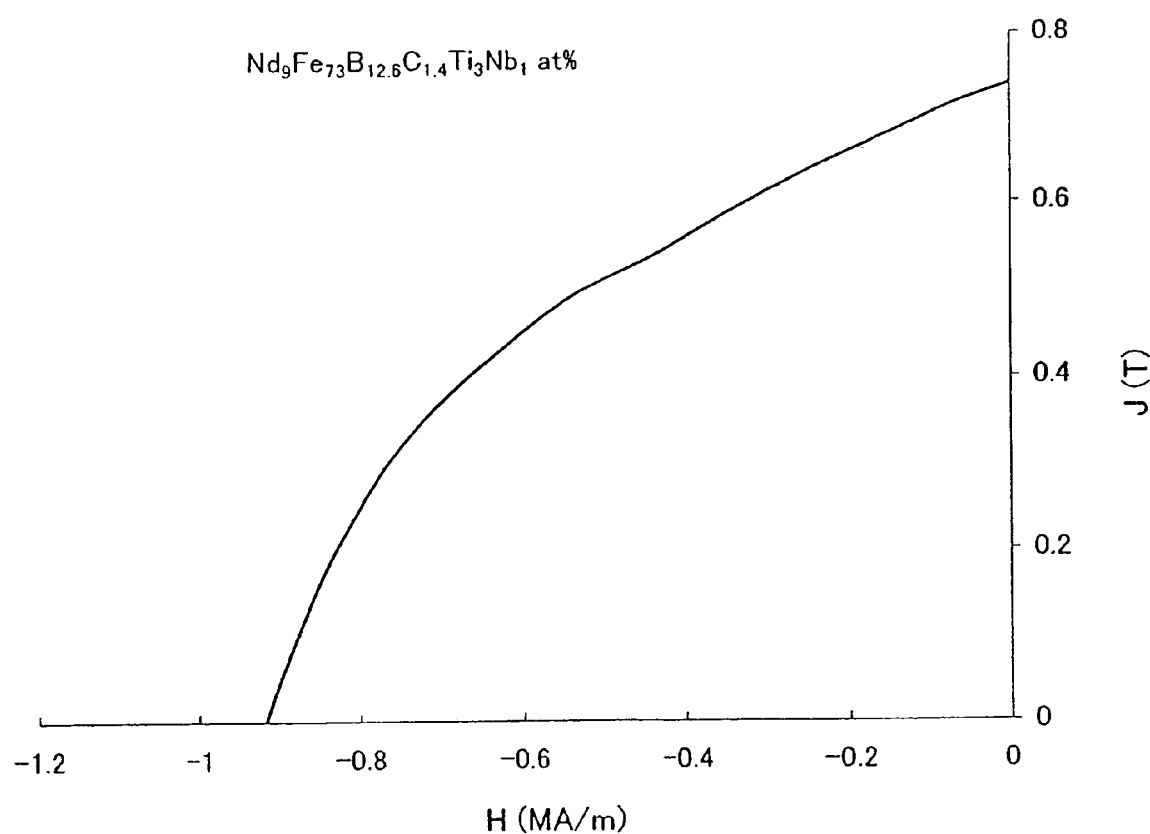
FIG. 2 is a graph showing a demagnetization curve (i.e., the second quadrant of a hysteresis curve) for an example of the present invention.

FIG. 1(a) shows an exemplary configuration for a gas atomization system to be preferably used in this embodiment. The system shown in FIG. 1(a) includes: a melting vessel 2 to melt an alloy by a high frequency heating or resistance heating process and store the resultant molten alloy 1 therein; and a spray chamber 4 in which a magnet powder (or atomized powder) 3 is formed by a gas atomization process. The melting chamber, in which the melting vessel 2 is provided, and the spray chamber 4 are preferably filled with an inert atmosphere (of argon or helium).

At the bottom of the melting vessel 2, a melt nozzle (with a nozzle orifice diameter of 0.5 mm to 3.0 mm) 5 is provided such that the molten alloy 1 is ejected through the melt nozzle 5 into the spray chamber 2. A ringlike gas nozzle 6 such as that shown in FIG. 1(b) is provided under the melt nozzle 5. A cooling gas is ejected strongly toward the center of the ring through a plurality of holes of this ringlike gas nozzle 6. As a result, a great number of small droplets of the molten alloy are formed and rapidly quenched while being deprived of the heat by the surrounding gas. Then the rapidly quenched and solidified metal droplets are collected as the magnet powder 3 at the bottom of the gas atomization system.

When such a gas atomization system is used, the particle size distribution of the powder can be controlled by adjusting the viscosity of the molten alloy and the energy of the spray gas.

It should be noted that when a molten alloy having a poor ability to form amorphous phases is rapidly quenched and solidified by a gas atomization process, powder particles with an amorphous or nanocrystalline structure cannot be obtained unless the atomization process is carried out under such conditions as to form powder particles with particle sizes of 20 μm or less, for example. This is because the smaller the particle sizes of the powder particles to be obtained, the greater the ratio of the surface area to the volume of the respective particles and the higher the cooling effects. In the prior art, the greater the particle size, the lower the quenching rate of inside portions of particles. As a result, a crystal structure with an excessively large size is formed and the resultant magnet performance deteriorates. When such a phenomenon occurs, the magnet performance deteriorates significantly in a nanocomposite magnet powder, in particular.

In contrast, according to the present invention, even if the powder particle sizes are as large as 20 μm to 100 μm, the inside portions of the powder particles can also be rapidly quenched uniformly and at a sufficiently high rate. Thus, a nanocomposite magnet powder exhibiting excellent magnetic properties can be obtained.

Heat Treatment

Thereafter, the magnet powder, obtained by using the gas atomization system described above, is preferably thermally treated within an inert atmosphere of argon (Ar), for example. The temperature increase rate of the heat treatment process is preferably 0.08° C./s to 15° C./s. Specifically, the magnet powder is preferably maintained at a temperature of 500° C. to 800° C. for a period of time of 30 seconds to 60 minutes, and then cooled to room temperature. By carrying out this heat treatment process, an almost completely crystalline structure can be obtained even if some amorphous phases are left in the powder particles as a result of the gas atomization process.

The heat treatment atmosphere is preferably an inert gas such as Ar gas or $N_2$ gas to minimize the oxidation of the alloy. Alternatively, the heat treatment may also be carried out within a vacuum of 1.3 kPa or less.

It should be noted that if carbon is added to the material alloy, the oxidation resistance of the magnet powder can be increased. If a sufficient amount of carbon has been added to the material alloy, then the atomized powder may be heat-treated in the air. Also, the magnet powder of this embodiment already has a spherical shape when crystallized by the atomization process, and is not subjected to any mechanical pulverization process thereafter. Accordingly, the surface area of the powder per unit mass is far smaller than that of a known mechanically pulverized powder. Thus, the magnet powder is not oxidizable so easily even when exposed to the air during the heat treatment process or any other process.

In making a bonded magnet from this magnet powder, the magnet powder is compounded with an epoxy resin or a nylon resin and then molded into a desired shape. In this case, a magnet powder of any other type (e.g., a rapidly solidified alloy type magnet powder other than nanocomposite magnets, an Sm-T-N based magnet powder and/or hard ferrite magnet powder) may be mixed with the magnet powder of the present invention.

Why this Alloy Composition is Preferred

Q is either B (boron) only or a combination of B and C (carbon). If the mole fraction x of Q is 10 at % or less, then the amorphous forming ability will be too low to obtain the desired nanocrystalline structure easily at a normal quenching rate (of about $10^{2°}$ C./s to about $10^{4°}$ C./s) for a gas atomization process. On the other hand, if the mole fraction x of Q exceeds 25 at %, then the percentage of the α-Fe phase, which has a higher saturation magnetization than any other constituent phase, decreases excessively and the remanence $B_r$ drops. In view of these considerations, the mole fraction x of Q is preferably adjusted such that 10 at %<x≦25 at %. A more preferable x range is 10 at %<x≦20 at % and an even more preferable x range is 13 at %≦x≦18 at %.

C decreases the size of the metal structure in the rapidly solidified alloy, and therefore, plays an important role when the melt quenching rate is as low as in the gas atomization process. Also, by adding C, the nucleation of $TiB_2$ is minimized, thus decreasing the solidification start temperature of the molten alloy. As a result, the teeming temperature can be lowered. In that case, the alloy can be melted in a shorter time, and the quenching rate can be increased. However, if the atomic ratio of C to the total amount of Q exceeds 0.5, then the α-Fe will be produced noticeably, the constituent phases will change, and the magnetic properties will deteriorate. This is why the atomic ratio of C to the total amount of Q is preferably 0.01 to 0.5. A more preferable range is 0.05 to 0.3 and an even more preferable range is 0.08 to 0.20.

R is at least one element selected from the group consisting of the rare-earth elements and yttrium. R is an indispensable element for $R_2Fe_{14}B$, which is a hard magnetic phase that cannot be omitted to achieve permanent magnet properties. Specifically, R preferably includes Pr or Nd as an indispensable element, a portion of which may be replaced with Dy and/or Tb. If the mole fraction y of R is less than 6 at %, then the compound phase having the $R_2Fe_{14}B$ type crystal structure, which contribute to expressing coercivity, do not crystallize sufficiently and a coercivity $H_{cJ}$ of 480 kA/m or more cannot be obtained. On the other hand, if the mole fraction y of R is equal to or greater than 10 at %, then the percentages of the iron-based borides and α-Fe with ferromagnetic properties both decrease. For these reasons, the mole fraction y of the rare-earth element R is preferably 6 at %≦y<10 at %. A more preferable range for R is 7 at %≦y≦9 at %, and an even more preferable range for R is 7.5 at %≦y≦8.5 at %.

Ti is an indispensable element for a nanocomposite magnet according to the present invention. By adding Ti, high hard magnetic properties are achieved, and the loop squareness of the demagnetization curve is improved. As a result, the maximum energy product $(BH)_{max}$ can also be increased.

Unless Ti is added, the α-Fe easily nucleates and grows before the $R_2Fe_{14}B$ phase nucleates and grows. Accordingly, when the atomized alloy is thermally treated and crystallized, the soft magnetic α-Fe phase will have grown excessively.

In contrast, if Ti is added, the nucleation and growth kinetics of the α-Fe phase is slowed down, i.e., it would take a longer time for the α-Fe phase to nucleate and grow. Thus, the present inventors believe that the $R_2Fe_{14}B$ phase starts to nucleate and grow before the α-Fe phase has nucleated and grown. Thus, the $R_2Fe_{14}B$ phase can be grown sufficiently and distributed uniformly before the α-Fe phase has grown too much.

Also, Ti has a strong affinity for B and is easily condensed in an iron-based boride. Thus, the present inventors believe that Ti stabilizes an iron-based boride by producing a strong bond to B in the iron-based boride.

Furthermore, by adding Ti, the viscosity of the molten alloy decreases to $5 \times 10^{-6}$ m²/s or less. As a result, a preferred melt viscosity for the atomization process is obtained.

If the mole fraction of Ti exceeds 12 at %, then the production of the α-Fe is reduced significantly, thus decreasing the remanence Br unintentionally. On the other hand, if the mole fraction of Ti is lower than 0.1 at %, then the $R_2Fe_{14}B$ phase, which cannot be omitted to express the coercivity, will not crystallize sufficiently. Also, even if the $R_2Fe_{14}B$ phase has crystallized sufficiently, the desired uniform nanocrystalline structure cannot be obtained, either, and high coercivity cannot be achieved. In view of these considerations, a preferable z range is 0.1 at %≦z≦12 at %, and a more preferable z range is 1 at %≦z≦7 at %.

The element M is an element that increases the amorphous forming ability of the alloy. If M is added, the amorphous forming ability of the alloy increases and the growth of the crystalline phases can be minimized while the molten alloy is being quenched. And a magnet with good loop squareness in its demagnetization curve can be obtained as a result of the subsequent heat treatment process. In addition, by adding M, the intrinsic coercivity can also be increased.

If the mole fraction of M exceeds 10 at %, then the grain growth of the respective constituent phases advances remarkably in a relatively high temperature range in which the α-Fe phase grows rapidly, the exchange coupling among the respective constituent phases weakens, and the loop squareness of the demagnetization curve decreases significantly. For that reason, the mole fraction n of the element M preferably satisfies 0 at %≦n≦10 at %. A more preferable n range is 0.5 at %≦n≦8 at % and an even more preferable n range is 1 at %≦n≦6 at %. It should be noted that Al, Si, Mn, Cu, Ga, Ag, Pt, Au and/or Pb, as well as M, may also be added as an element that reduces the size of the metal structure.

The balance of the material alloy, other than the elements described above, may be Fe alone. Alternatively, at least one transition metal element T, selected from the group consisting of Co and Ni, may be substituted for a portion of Fe, because the desired hard magnetic properties are achievable in that case also. However, if the percentage m of Fe replaced with T exceeds 50%, then a high remanence Br cannot be obtained. For that reason, the percentage m of Fe replaced is preferably 50% or less (i.e., 0≦m≦0.5). A more preferable highest allowable replacement percentage m is 40%. Also, by substituting Co for a portion of Fe, the hard magnetic properties improve and the Curie temperature of the $R_2Fe_{14}B$ phase increases, thus increasing the thermal resistance.

Manufacturing Process

To make a permanent magnet powder by an atomization process from a molten alloy having the composition described above, a gas atomization process, a centrifugal atomization process, a rotational electrode process, a vacuum process, an impact process or any other suitable process may be adopted.

If a gas atomization process is adopted, the melt may be sprayed into the inert gas through a nozzle with a nozzle orifice diameter of 0.5 mm to 3.0 mm. In this case, the melt may be sprayed on a high-velocity inert gas flow. This gas may have a pressure of 0.1 MPa to 7 MPa, for example. According to the gas atomization method, the particle size distribution of the powder can be controlled by adjusting the viscosity of the molten alloy and the energy of the spray gas.

When a molten alloy having a poor ability to form amorphous phases is rapidly quenched and solidified by a gas atomization process, powder particles with an amorphous or nanocrystalline structure cannot be obtained unless the atomization process is carried out under such conditions as to form powder particles with particle sizes of 20 μm or less, for example. This is because the smaller the particle sizes of the powder particles to be obtained, the greater the ratio of the surface area to the volume of the respective particles and the higher the cooling effects. In the prior art, the greater the particle size, the lower the quenching rate of inside portions of particles. As a result, a crystal structure with an excessively large size is formed and the resultant magnet performance deteriorates. When such a phenomenon occurs, the magnet performance deteriorates significantly in a nanocomposite magnet powder, in particular.

In contrast, according to the present invention, even if the powder particle sizes are as large as 20 μm to 100 μm, the inside portions of the powder particles can also be rapidly quenched uniformly and at a sufficiently high rate. Thus, a nanocomposite magnet powder exhibiting excellent magnetic properties can be obtained.

EXAMPLES

For each of Samples Nos. 1 through 4 having the compositions shown in the following Table 1, respective materials thereof. Nd, Pr, Fe, Co, B, C, Ti, Nb, Zr, Si and Cu having purities of 99.5% or more were weighed so that the mixture had a total weight of 1 kg (kilogram). The mixture was subjected to a gas atomization process under the following conditions, thereby making a powder with a mean particle size of about 50 μm. Thereafter, the powder particles were classified to obtain a powder with particle sizes of 63 μm or less.

Gas used: argon (Ar);
Gas pressure: 40 kgf/cm² (=3.92 MPa);
Spraying temperature: 1,400° C.; and
Melt feeding rate: 2.0 kg/min.

TABLE 1

| | No. | R | T | Q | Ti | M | Other | Heat Treatment Temperature (° C.) |
|---|---|---|---|---|---|---|---|---|
| EXAMPLES | 1 | Nd9 | Fe as balance | B12.6 + C1.4 | 3 | Nb1 | — | 740 |
| | 2 | Nd7.4 | Fe as balance | B11 + C2 | 3 | Nb1 | Si0.5 | 720 |
| | 3 | Nd7.6 | Co5 + Fe as balance | B12.5 + C2.5 | 4 | Nb0.3 + Zr0.1 | Cu0.2 | 740 |
| | 4 | Nd8.4 + Pr0.5 | Fe as balance | B12 + C1 | 1 | Zr2.6 | — | 720 |

In Table 1, "Nd7.8+Pr0.6" included in the column "R" indicates that 7.8 at % of Nd and 0.6 at % of Pr were added, and "B12+C1" included in the column "Q" indicates that 12 at % of B (boron) and 1 at % of C (carbon) were added.

Next, this atomized powder was heated to, and maintained at, any of the heat treatment temperatures shown in Table 1 for five minutes within an Ar gas atmosphere and then cooled to room temperature. The magnetic properties of the thermally treated atomized powder were measured with a vibrating sample magnetometer (VSM). The results obtained from powders with particle sizes of 25 μm or less are shown in the following Table 2 and the demagnetization curve of the thermally treated atomized powder is shown in FIG. 1.

TABLE 2

| | | $B_r$ (T) | $H_{cJ}$ (kA/m) | $(BH)_{max}$ (kJ/m³) |
|---|---|---|---|---|
| EXAMPLES | 1 | 0.74 | 901 | 81.2 |
| | 2 | 0.79 | 605 | 84 |
| | 3 | 0.77 | 629 | 79.6 |
| | 4 | 0.70 | 933 | 75.8 |

As can be seen, a nanocomposite magnet powder exhibiting hard magnetic properties including a coercivity $H_{cJ} \geq 480$ kA/m and a remanence $B_r \geq 0.6$ T can be obtained according to this example.

According to the present invention, even though an atomization process, which results in a lower quenching rate than a melt spinning process or any other rapid quenching process, is adopted, the $R_2Fe_{14}B$ phase can be nucleated earlier than the α-Fe phase by optimizing the alloy composition and adding Ti thereto. As a result, a magnet powder with a nanocrystalline structure that can exhibit excellent magnetic properties as a nanocomposite magnet can be obtained. In addition, according to the present invention, spherical particles for an alloy magnet can be directly produced by the atomization process. Thus, no pulverizing process step is needed, and the manufacturing cost of magnets can be reduced significantly.

The invention claimed is:

1. A nanocomposite magnet powder of an iron-based rare-earth alloy having a composition represented by the general formula:

(Fe$_{1-m}$T$_m$)$_{100-x-y-z-n}$Q$_x$R$_y$Ti$_z$M$_n$ (where T is at least one element selected from the group consisting of Co and Ni; Q is at least one element selected from the group consisting of B and C; R is at least one element selected from the group consisting of the rare-earth metal elements and yttrium; and M is at least one element selected from the group consisting of Nb, Zr, Mo, Ta and Hf), the mole fractions x, y, z, m and n satisfying the inequalities of:

10 at %<x≦25 at %;
6 at %≦y<10 at %;
0.1 at %≦z≦12 at %;
0≦m≦0.5; and
0 at %≦n≦10 at %, respectively, wherein the nanocomposite magnet powder is obtained by an atomization process and includes at least two types of ferromagnetic crystalline phases, in which an $R_2Fe_{14}B$ type compound phase serving as a hard magnetic phase has an average grain size of 10 nm to 200 nm and a soft magnetic phase has an average grain size of 1 nm to 50 nm;

a ferromagnetic iron-based boride phase and an α-Fe phase serving as the soft magnetic phase are present on a grain boundary or sub-boundary of the $R_2Fe_{14}B$ type compound phase; and the average crystal grain size of the ferromagnetic iron-based boride phase and α-Fe is smaller than that of the $R_2Fe_{14}B$ type compound phase.

2. The iron-based rare-earth alloy nanocomposite magnet powder of claim 1, wherein the $R_2Fe_{14}B$ type compound phase, the boride phase and the α-Fe phase are present in the same metal structure.

3. The iron-based rare-earth alloy nanocomposite magnet powder of claim 1, wherein the iron-based boride includes $Fe_3B$ and/or $Fe_{23}B_6$.

4. The iron-based rare-earth alloy nanocomposite magnet powder of claim 1, wherein the magnet powder has a mean particle size of 1 μm to 100 μm.

5. The iron-based rare-earth alloy nanocomposite magnet powder of claim 1, wherein the magnet powder exhibits hard magnetic properties including a coercivity $H_{cj} \geq 480$ kA/m and a remanence $B_r \geq 0.6$ T.

6. A bonded magnet comprising the iron-based rare-earth alloy nanocomposite magnet powder of claim 1.

7. A method of making an iron-based rare-earth alloy nanocomposite magnet powder, the method comprising the steps of:

obtaining a rare-earth alloy magnet powder by rapidly cooling a melt of an alloy by an atomization process, the alloy having a composition represented by the general formula: $(Fe_{1-m}T_m)_{100-x-y-z-n}Q_xR_yTi_zM_n$ (where T is at least one element selected from the group consisting of Co and Ni; Q is at least one element selected from the group consisting of B and C; R is at least one element selected from the group consisting of the rare-earth metal elements and yttrium; and M is at least one element selected from the group consisting of Nb, Zr, Mo, Ta and Hf), the mole fractions x, y, z, m and n satisfying the inequalities of:

10 at %<x≦25 at %;
6 at %≦y<10 at %;
0.1 at %≦z≦12 at %;
0≦m≦0.5, and
0 at %≦n≦10 at %, respectively; and thermally treating the magnet powder, thereby forming a structure that includes at least two types of ferromagnetic crystalline phases, in which an $R_2Fe_{14}B$ type compound phase serving as a hard magnetic phase has an average grain size of 10 nm to 200 nm and a soft magnetic phase has an average grain size of 1 nm to 50 nm; wherein a ferromagnetic iron-based boride phase and an α-Fe phase serving as the soft magnetic phase are present on a grain boundary or sub-boundary of the $R_2Fe_{14}B$ type compound phase; and the average crystal grain size of the ferromagnetic iron-based boride phase and α-Fe is smaller than that of the $R_2Fe_{14}B$ type compound phase.

8. The method of claim 7, wherein the step of rapidly cooling the melt by the atomization process results in making a rapidly solidified alloy including at least 60 vol % of the $R_2Fe_{14}B$ type compound phase.

9. The method of claim 7, wherein the iron-based boride includes $Fe_3B$ and/or $Fe_{23}B6$.

10. A method for producing a bonded magnet, the method comprising the steps of:

preparing an iron-based rare-earth alloy nanocomposite magnet powder by the method claim 7, and processing the magnet powder into the bonded magnet.

* * * * *